United States Patent
Fournel

[11] Patent Number: 6,091,291
[45] Date of Patent: Jul. 18, 2000

[54] DEVICE FOR THE GENERATION OF A VOLTAGE PULSE

[75] Inventor: Richard Fournel, Lumbin, France

[73] Assignee: STMicroelectronics S.A., Gentilly, France

[21] Appl. No.: 09/220,869

[22] Filed: Dec. 23, 1998

[30] Foreign Application Priority Data

Dec. 24, 1997 [FR] France ................................. 97 16463

[51] Int. Cl.[7] ................................................. G05F 1/10
[52] U.S. Cl. ............................ 327/589; 327/536; 363/60
[58] Field of Search ....................... 327/333, 390, 327/392, 398, 399, 536, 589, 534; 307/110; 363/59, 60

[56] References Cited

U.S. PATENT DOCUMENTS

| | | | |
|---|---|---|---|
| 4,382,194 | 5/1983 | Nakano et al. | 307/264 |
| 4,388,537 | 6/1983 | Kanuma | 327/536 |
| 4,656,574 | 4/1987 | Salchli | 307/110 |
| 4,970,409 | 11/1990 | Wada et al. | 307/296.1 |
| 4,999,761 | 3/1991 | Bingham et al. | 307/110 |
| 5,499,209 | 3/1996 | Oowaki et al. | 365/189.11 |
| 5,512,845 | 4/1996 | Yuh | 326/88 |
| 5,666,313 | 9/1997 | Ichiguchi | 365/195 |
| 5,939,935 | 8/1999 | Merritt | 327/589 |

*Primary Examiner*—Timothy P. Callahan
*Assistant Examiner*—Jung Ho Kim
*Attorney, Agent, or Firm*—Theodore E. Galanthay; Allen, Dyer, Doppelt, Milbrath & Gilchrist, P.A.

[57] ABSTRACT

A device for generating a voltage pulse in a low-voltage integrated circuit includes a capacitor and a control circuit. An input signal having negative pulses is received by the device. The input signal has a high level corresponding to a level of a logic supply voltage for the device, and a low level corresponding to zero volts. The control circuit includes a first and a second circuit element. The first circuit element transmits the low level of the input signal to a second terminal of the capacitor and also provides the capacitor a charging path. The second circuit element transmits the low level of the input signal to a first terminal of the capacitor with a predetermined delay so that a negative pulse between the high level and a negative level is provided at the second terminal of the capacitor in response to the input signal.

24 Claims, 6 Drawing Sheets

DEVICE FOR THE GENERATION OF A VOLTAGE PULSE

FIELD OF THE INVENTION

The present invention relates to integrated circuits, and, more particularly, to a device for generating a voltage pulse for a low supply voltage level integrated circuit.

BACKGROUND OF THE INVENTION

There is a current trend towards reducing the supply voltage level of integrated circuits, especially to reduce their electrical consumption. This forces designers of integrated circuits to develop appropriate technologies to reduce the levels of the threshold voltages of transistors so that these transistors operate at a lower voltage with sufficient reliability. Taking as example the prior art 0.25 micron CMOS technology, a sum of the threshold voltages of a P-type transistor ($|Vtp|$=475 mV) and an N-type transistor (Vtn=469 mV) reaches about 900 millivolts. Accordingly, there will be some difficulties in obtaining the operation of a device using this technology at a logic supply voltage of 1 volt or less.

One way of operating an integrated circuit at a low or a very low voltage is to modify the characteristics of certain transistors placed on critical conduction paths. For this purpose, it is possible to use a negative voltage level instead of the zero voltage commonly used. In particular, applying a negative voltage level to a P-type MOS transistor gate makes it more conductive than if a zero voltage were to be applied.

As a result, it is possible to compensate part of the loss due to the threshold voltage of this transistor. It is also possible to apply the negative voltage to a drain of the transistor or to use it to bias a well to appropriately modify a characteristic. For example, modification can be made to the well-substrate voltage of a transistor or in the reduction of the conduction of the transistor. A result of using a negative voltage level is an increased operating range at lower voltages.

SUMMARY OF THE INVENTION

The invention relates to the generation of a negative voltage level. More specifically, the invention relates to the generation of a voltage pulse whose high and low levels are respectively Vdd and a negative level Vneg. These voltage pulses are derived from a control pulse whose high and low levels are respectively Vdd and 0 volts. The pulse generated may be applied to a weak load, e.g., gates, drains or sources of transistors. The generation device according to the invention is capable of operating at a supply voltage of 1 volt or less.

Instead of generating a negative high voltage (–5 or –10 volts), which would lead to problems of oxide breakdown, a low negative voltage of approximately a few hundred millivolts is generated. The theoretical minimum is –Vdd. For example, for Vdd=+1.3 volts, it is possible to have Vneg=–1.12 volts. The prior art devices used for generating a negative voltage only provide high negative levels (–10 volts) and, in practice, they do not work at less than 1.8 volts for the supply voltage. Primarily, they are not capable of providing a voltage signal that has a positive level very close to Vdd and, following a command, goes to a negative level as close as possible to –Vdd.

It has therefore been sought to obtain a device capable of resolving the above described problems in the prior art. One approach is a device used for generating a pulse, wherein the device includes a capacitor and a control circuit. The control circuit includes an input for receiving an input signal with negative pulses between a level VDD of the logic supply voltage of the device and zero volts. The control circuit also includes a first circuit element for transmitting the low level of the input signal to a second terminal of the capacitor. The control circuit also provides the capacitor a charging path, and a second circuit element for transmitting the low level of the input signal to a first terminal of the capacitor. This is performed with a predetermined delay to produce at the second terminal of the capacitor a negative pulse between the high level VDD and a negative level VNEG in response to the input negative pulse.

The device according the invention may be used, in particular, to control one or more gates, drains or sources of transistors and to modify characteristics of these transistors for enabling the lowering of a level of the logic supply voltage Vdd. The supply voltage Vdd reliably supplies different elements of a low voltage integrated circuit.

BRIEF DESCRIPTION OF THE DRAWINGS

Other features and advantages of the invention are presented in the following description, given by way of an indication that in no way restricts the scope of the invention, with reference to the appended drawings, of which.

DETAILED DESCRIPTION OF THE PREFERRED EMBODIMENTS

To describe the present invention, application is made to a low voltage integrated circuit using MOS (or CMOS) technology on a P-type substrate.

The P-type transistors are made in a well of N-type material which is biased. Furthermore, the same reference is used to designate the voltage level and the corresponding voltage signal. In particular, Vdd designates both the signal of the logic supply voltage applied to the integrated circuit and its level.

Figure 1:
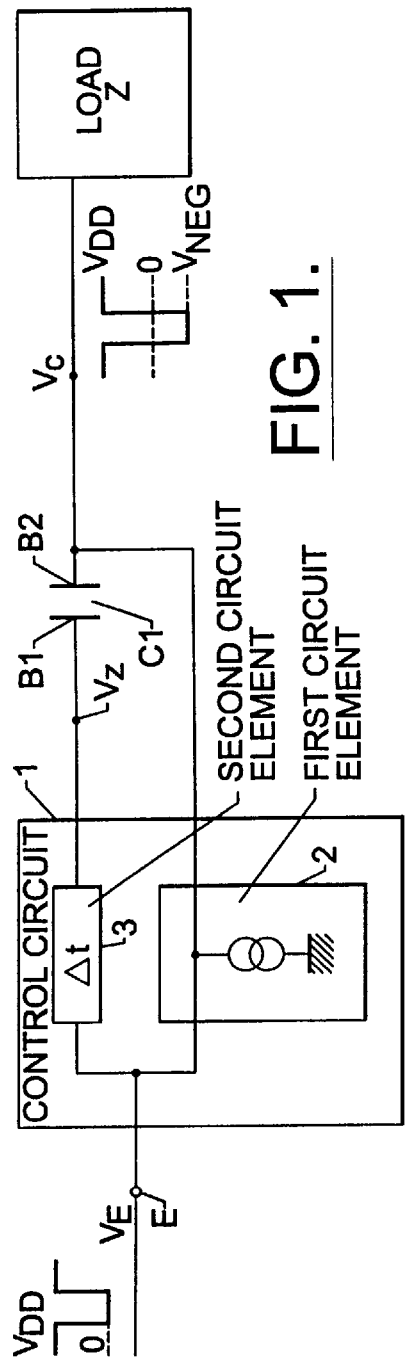
FIG. 1 is a drawing of a device for the generation of a negative voltage pulse between a high level Vdd and a low level of negative voltage Vneg, according to the present invention.

FIG. 1 shows a block diagram of a device for the generation of a negative voltage pulse between the level Vdd of the logic supply voltage (positive) and a negative voltage level Vneg. This device comprises a capacitor C1 and a control circuit 1. The capacitor C1 has a first terminal B1 and a second terminal B2. The control circuit 1 receives a voltage signal Ve at an input E. This input voltage signal Ve is a signal with negative pulses between Vdd and zero volts. In one embodiment, the input voltage signal Ve is a clock signal.

The control circuit 1 has a first circuit element 2 to apply the low level of the input signal Ve to the second terminal B2 of the capacitor C1. The control circuit 1 also has a second circuit element 3 to apply the same low level of the input signal Ve to the first terminal B1, but with a certain delay Dt. At the terminal B1, there is a voltage signal referenced Vz. At the terminal B2, the output voltage signal referenced Vc is retrieved and applied to a load Z. The output signal Vc is a signal with negative pulses having a high level Vdd, and a low negative level Vneg whose mc)st negative level can be −Vdd in theory. The first circuit element 2 transmits the low level of the signal Ve and provides a path for charging the capacitor C1.

Figure 3:
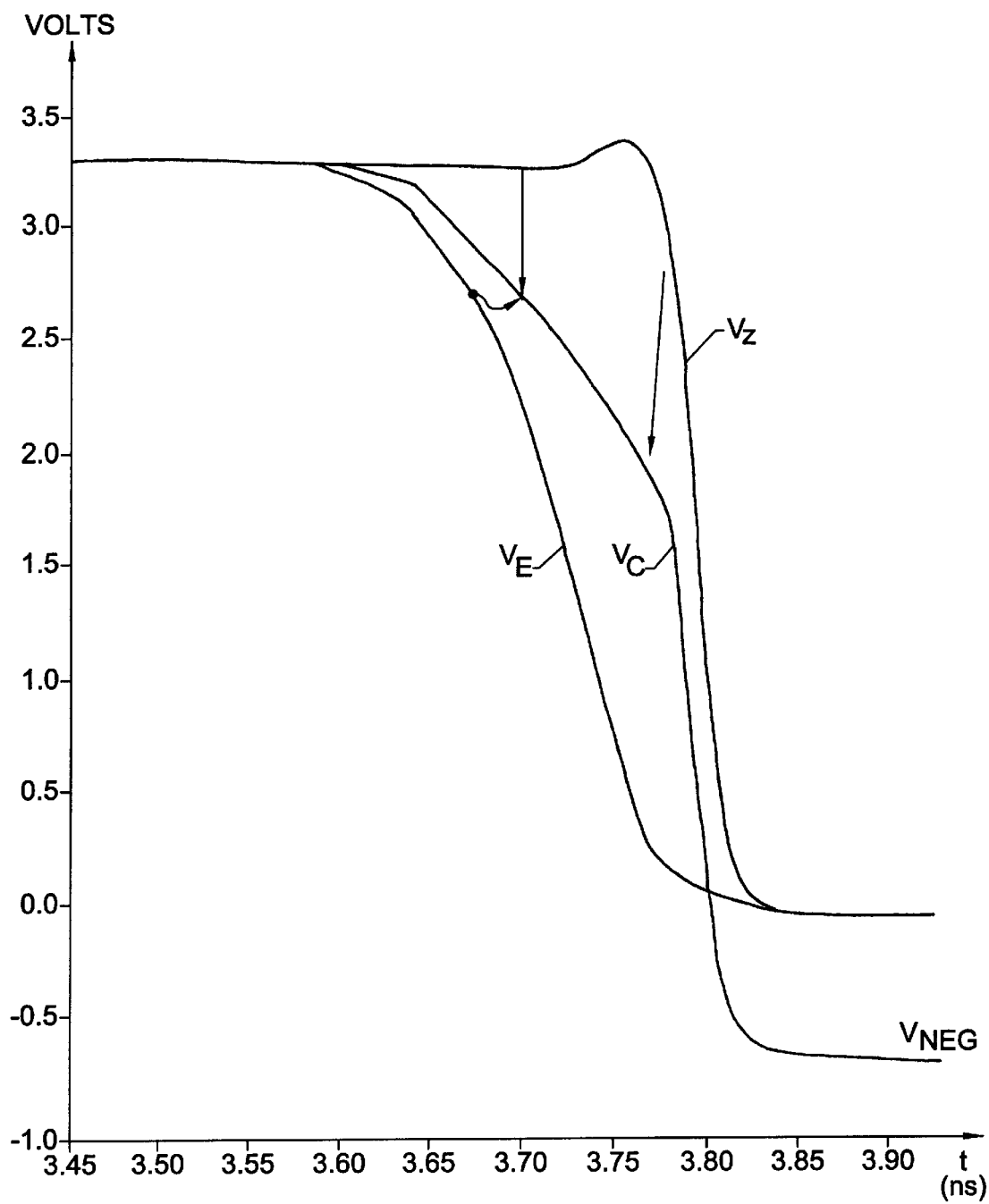
FIGS. 3, 4a and 4b show voltage signals obtained with a device according to the present invention.

As shown in FIG. 3, the input signal Ve causes he signals Vc and Vz to drop from the high level Vdd. The two terminals B1 and B2 of the capacitor C1 are at the same potential Vdd. When a transition Vdd to zero appears on the signal Ve, this transition is immediately transmitted to the second terminal B2 of the capacitor C1, while the signal Vz is still at Vdd. The capacitor C1 is charged through the first circuit element 2 of the control circuit 1 and the level of the signal Vc decreases towards zero volts. When the low level of the input signal Ve reaches; the terminal B1 of the capacitor C1 (signal Vz), this has the effect of changing the voltage of the terminal B2 of the capacitor C1 into a negative voltage. This effect is shown in FIG. 3. When the signal Ve returns to its inactive high level (Vdd), the signal Vc also returns to this level (Vdd).

Figure 2:
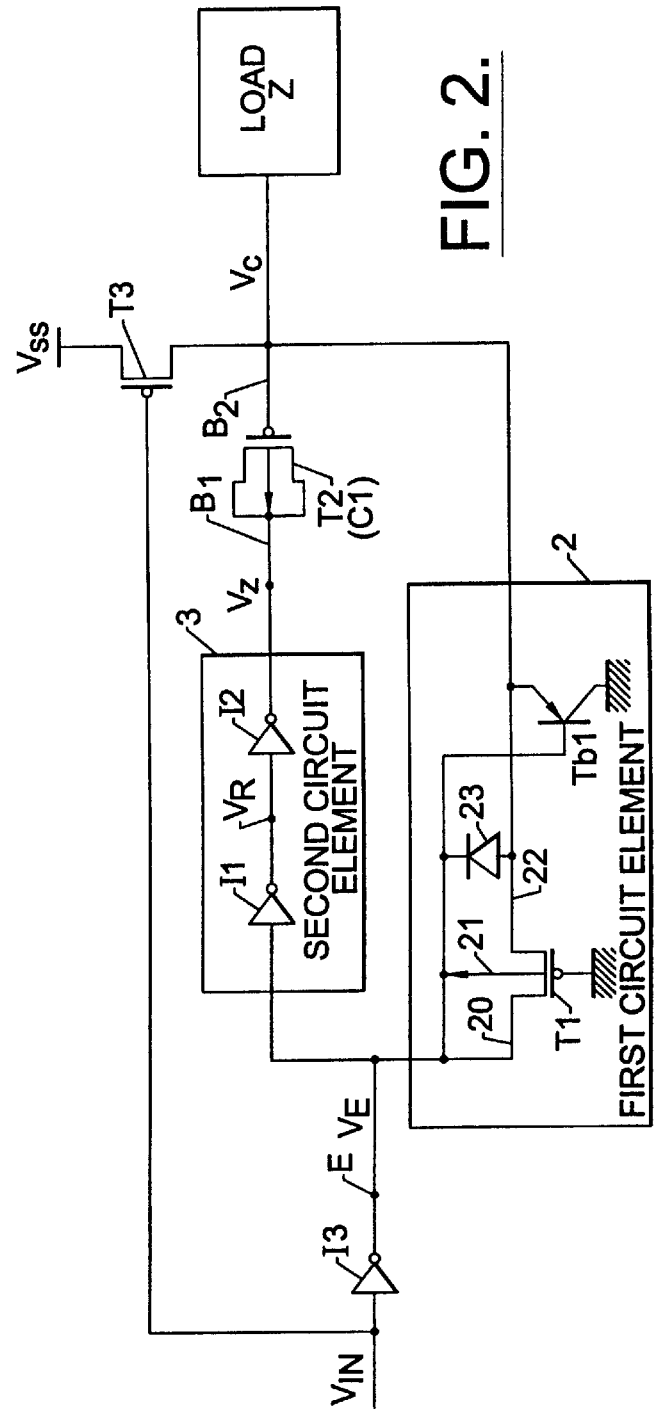
FIG. 2 shows a detailed diagram of an exemplary embodiment of this device illustrated in FIG. 1.

FIG. 2 shows a detailed drawing of an exemplary embodiment of a device according to the invention for a CMOS or MOS technology integrated circuit. This circuit can easily be adapted to other technologies, especially bipolar technology. In the exemplary embodiment shown in FIG. 2, the first circuit element 2 is a P-type transistor T1. It has its source 20 connected to the input E and its drain 22 connected to the terminal B2. Its gate is connected to ground. In addition, the body 21 of this transistor T1 is connected to the source 20. This transistor T1 thus transmits the low level of the input signal Ve to the terminal B2 of the capacitor C1. Furthermore, this transistor T1 provides for the charging of the capacitor C1 by pulling the terminal B2 of the capacitor towards ground. The MOS structure is not very efficient in this function, but the parasitic bipolar transistor Tb1 inherent in the structure pulls a very high bipolar current towards ground. Furthermore, the drain-body diode 23 is conductive at this tire.

These different components support the conduction of the voltage at the terminal B2 to ground during the charging of the capacitor C1. In practice, it is possible to replace the MOS transistor T1 by a bipolar transistor mounted like the PNP parasitic bipolar transistor Tb1. This transistor Tb1 has its gate controlled by the input signal Ve. The transistor Tb1 is connected between the terminal B2 of the capacitor C1 (by its emitter) and ground (by its collector). This is particularly advantageous for an integrated circuit using bipolar technology. A diode could also be used instead of the transistor T1, with comparable results, mounted as the diode 23 of the drain-body transistor. In this case, it is possible to use a doped polysilicon type diode.

The second circuit element 3, whose function is to transmit the low level of the input voltage signal Ve with a certain delay Dt, includes two inverters (CMOS inverters) I1 and I2 in the example illustrated in FIG. 2. However, other delay circuits could be used. Conventionally, the body is connected to the supply voltage. But preferably, and as shown in FIG. 2, the body 21 of this transistor T1 is connected to the terminal B1. The capacitor C1 is formed by a P-type transistor T2 whose drain and source are joined together to form the terminal B1. The terminal B2 is formed by the gate of the transistor T2. Equivalent devices for the capacitor C1 include a pure capacitor or a depleted MOS transistor. The output signal Vc available at the terminal B2 of the transistor T2 is applied to a load circuit Z.

Figure 4A:
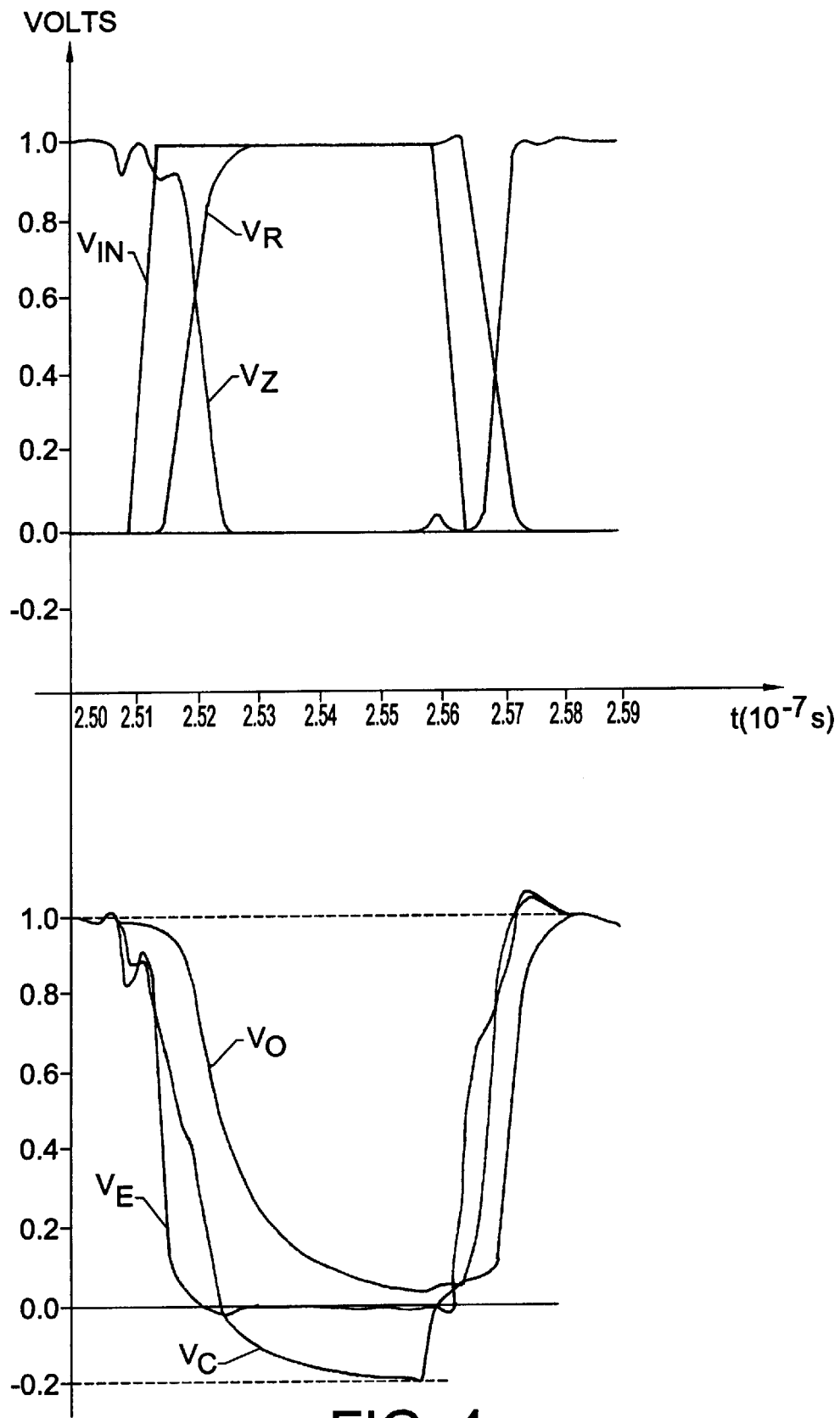
Figure 4B:
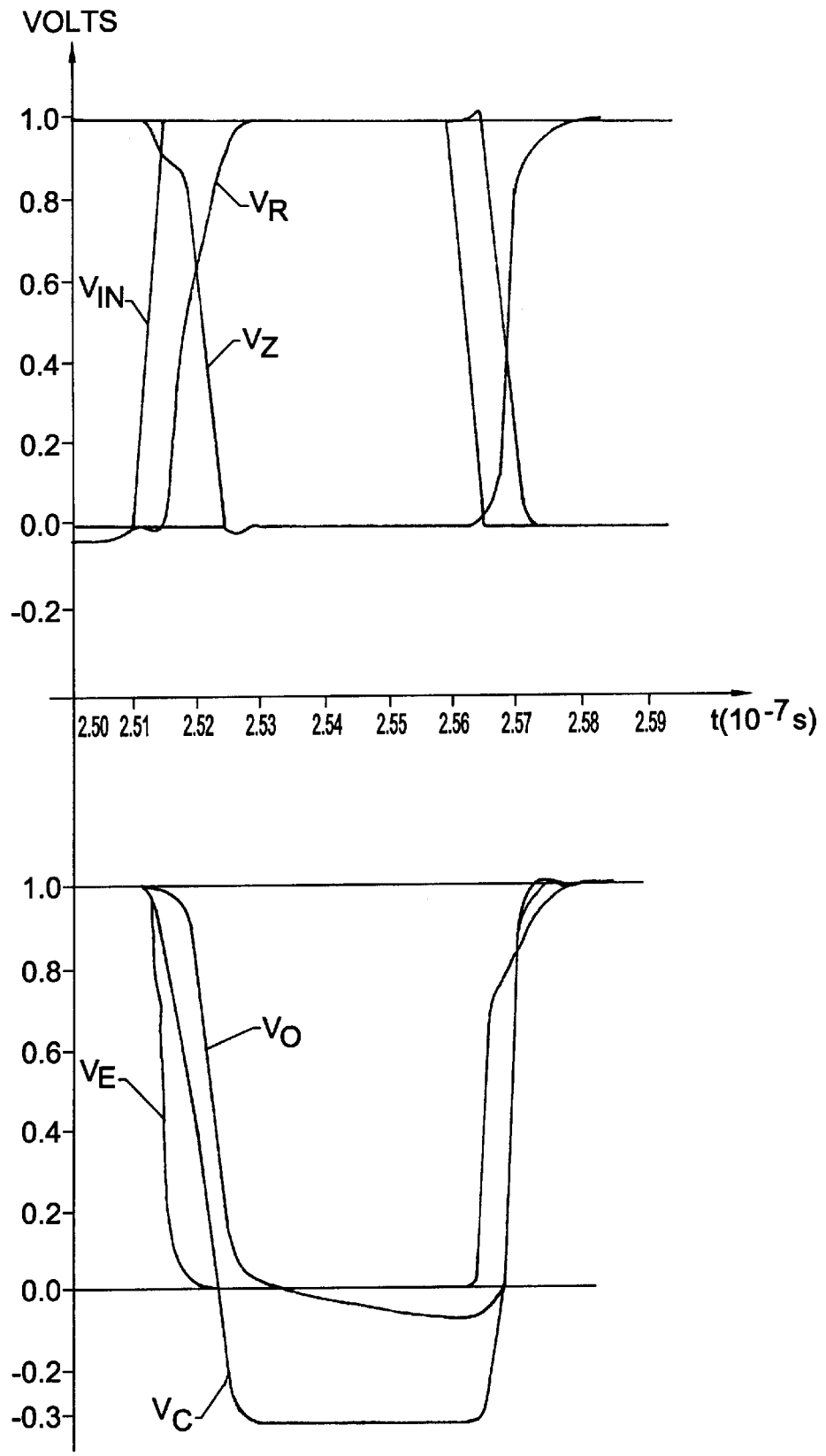

Advantageously, to keep the inactive level Vdd on the voltage signal Vc independent of the load Z, a third transistor T3 is connected between the supply voltage Vdd and the terminal B2. This sets the level Vdd as long as the input signal Ve remains at Vdd. For this purpose, the input signal will be provided by an inverter I3 that provides the input signal Ve from an activation signal Vin. If Vr is the reference of the voltage signal between the two inverters I1 and I2, it is possible to obtain the signals Vin, Ve, Vr, Vz and Vc as shown in FIGS. 4a and 4b for a supply voltage Vdd of 1 volt. These signals correspond to a simulation in which the load Z is simulated by the gate and the body of a P-type MOS load transistor (not shown) with a W/L ratio of 190 $\mu$/0.275 $\mu$. The output voltage Vc is applied to the gate and to the body of this load transistor.

FIG. 4a corresponds to the configuration where the body of the transistor T2 forming the capacitor is conventionally connected to the logic supply voltage Vdd (not shown). Accordingly, a negative level of about −200 millivolts is reached on the output signal Vc. However, as illustrated in FIG. 4a, this negative output level is not very stable and the other voltage signals show parasitic peaks. The connection of the body to the fixed logic supply voltage Vdd is equivalent to two capacitors for the structure, one connected to Vdd and the other to Vc. As a result, efficiency is lost.

FIG. 4b corresponds to the configuration where the body is connected as indicated above, and as indicated in FIG. 2 to the potential Vz, which varies. The parasitic peaks have disappeared and it becomes possible to obtain a more negative level of about −300 millivolts on the output signal Vc. This negative level is also more stable. The connection of the body to the source and to the drain of the transistor T2 contributes to a better result. In practice, the geometries of the transistors T1 and T2 are determined to have a capacitance that is not excessively high for the capacitor C1, and to let through as much current as possible. The latter is accomplished by making the transistor T1 large.

Figure 5:
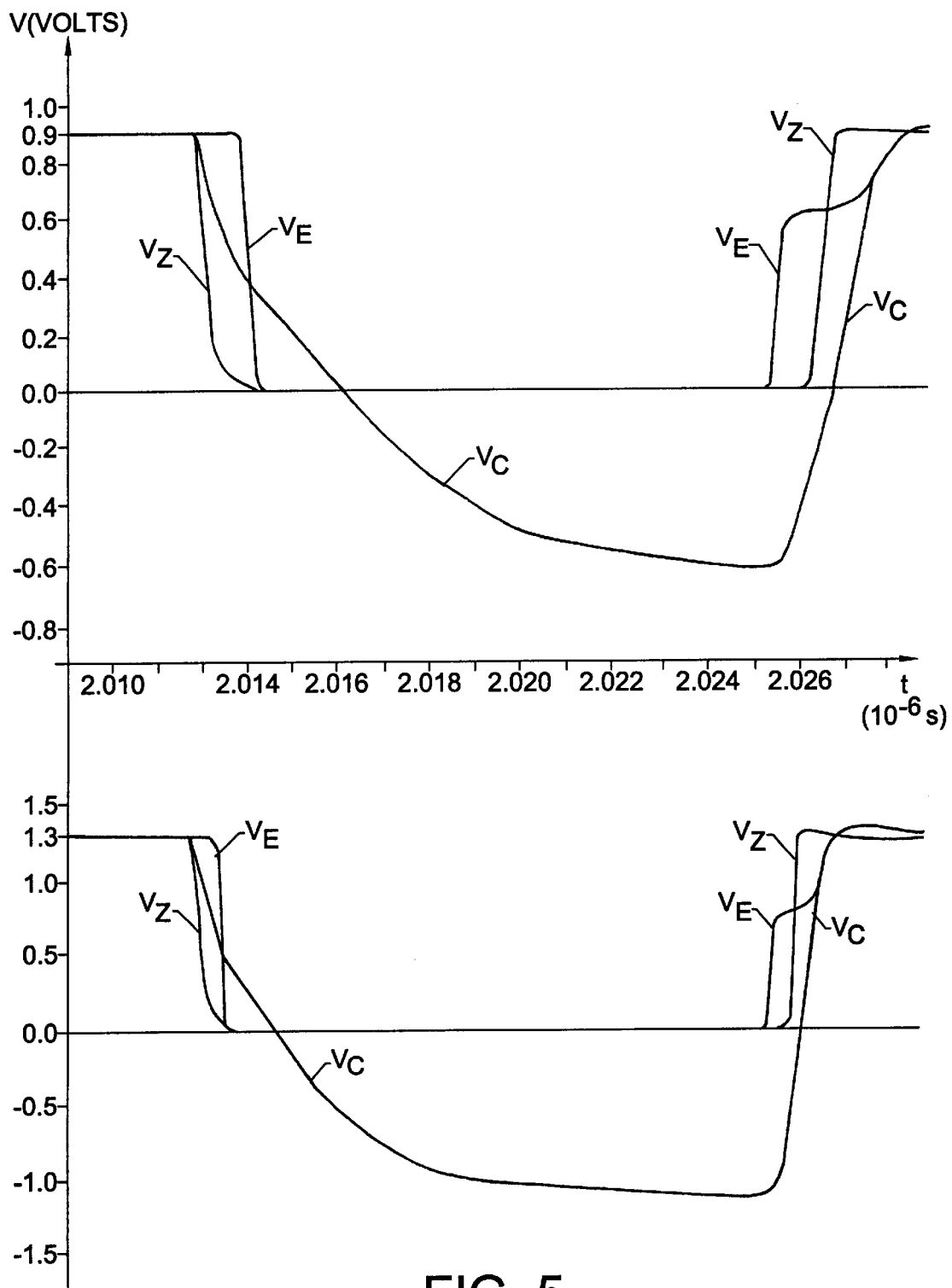
FIG. 5 shows the voltage signals obtained with different sizes of the elements of the device, according to the present invention.

FIG. 5 thus shows the signals Ve, Vz and Vc obtained with sizes of the transistor T2 and of the capacitor C1 optimized to provide a more negative level at output on the same load Z than above. It is thus possible to reach a level Vneg of −0.6 volts for a voltage level Vdd of 0.9 volts, and −1.2 volts for a voltage level Vdd of 1.3 volts. This is close to the theoretical negative level −Vdd. With a device according to the invention, negative voltages are provided in the range of the threshold voltage of the transistors, or even smaller (more negative). The pulse obtained at the output has a high level Vdd and a low level Vneg which enables the control of a weak load, e.g., gates, drains or sources of transistors.

Figure 6:
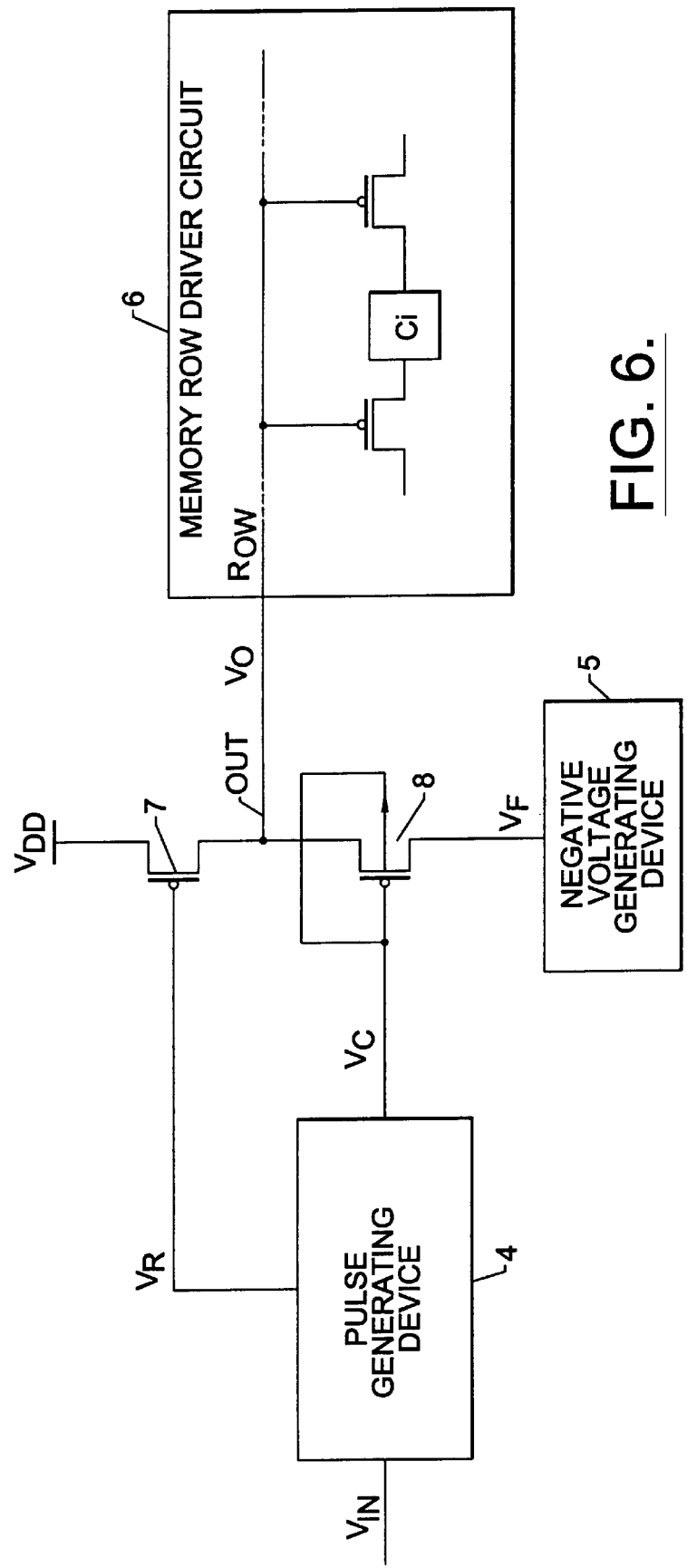
FIG. 6 shows an exemplary use of a device for the generation of a pulse used for switching a negative control voltage to a load, according to the present invention.

FIG. 6 shows a practical example of a pulse generator according to the invention. In this example, a negative control voltage referenced Vf is switched over to a load Z which is a row of cells Ci within a dynamic memory. The negative control voltage referenced Vf is more negative or equal to the level Vneg. A device 4 for the generation of a pulse according to the invention is provided for delivering an output signal Vc having the characteristics described above. Also provided is a device 5 for generating a negative voltage Vf that may be a load pump type. The output signal Vc is applied to a row driver circuit 6 to switch over the negative voltage Vf to an output OUT connected to a row Row of cells Ci within a dynamic memory. The load pump device 5, as well as the dynamic memory cells, may be any type well known to one skilled in the art.

The row driver circuit 6 comprises, in the example, two P-type MOS transistors series-connected between the voltage Vdd and the negative voltage Vf. The first transistor 7 is connected between the voltage Vdd and the output voltage OUT. The second transistor 8 is connected between the output node OUT and the negative voltage Vf. This second transistor 8 is controlled by the signal Vc whose inactive level is Vdd, which turns off the transistor 8. When the device is activated with the positive pulse on Vin, there is a negative pulse on Vc whose level goes to Vneg. The transistor 8 is then on and the voltage Vneg is transmitted to the output node OUT. This assumes that the first transistor 7 is off at this time. In practice, the transistor 7 is off before the transistor 8 conducts to minimize any losses. This is obtained by controlling the gate of this transistor 7 by the voltage signal Vr.

Under these conditions, if the voltage Vf is more negative than the level Vneg by at least one Vtp, the level Vneg is retrieved at the output node OUT. The P-type transistor cannot let through less than its gate level Vneg. If the level Vnegz is more negative than the voltage Vf, the value Vf–Vtp is retrieved at the output node OUT. Thus, the device of the invention makes the transistor 8 more conductive. The device also compensates (at least partly) for the threshold voltage of this transistor 8. To improve the switching speed, the body of the transistor 8 is connected to Vc. In this exemplary application, a pulse generator according to the invention can be advantageously used in low voltage circuits to control a low voltage load.

That which is claimed is:

1. A device for generating a voltage pulse, the device comprising:
    a capacitor having first and second terminals; and
    a control circuit comprising
        an input for receiving an input signal having negative pulses with a high level corresponding to a logic supply voltage for the device and a low level corresponding to zero volts,
        a first circuit for transmitting the low level of the input signal to the second terminal of said capacitor and for providing said capacitor a charging path, and
        a second circuit for transmitting the low level of the input signal to the first terminal of said capacitor with a predetermined delay so that a negative pulse between the high level and a negative level is provided at the second terminal of said capacitor in response to the negative pulse signal.

2. A device according to claim 1, wherein said first circuit comprises a bipolar transistor being connected between the second terminal of said capacitor and ground, and having a base controlled by the input signal.

3. A device according to claim 2, wherein said bipolar transistor comprises a parasitic bipolar transistor of a P-type MOS transistor formed in a well, the P-type MOS transistor having a source, a drain, a gate, and a body; and wherein the source and the body are connected together to an input node of the device, the drain is connected to the second terminal of said capacitor, and the gate is connected to ground.

4. A device according to claim 1, wherein said first circuit comprises a diode.

5. A device according to claim 1, wherein said first circuit element comprises a P-type MOS transistor formed in a well and having a drain and a body forming a diode, said P-type MOS transistor having a source and the body connected together to an input node of the device, a drain connected to the second terminal of said capacitor, and a gate connected to ground.

6. A device according to claim 4, wherein said diode comprises doped polysilicon having a cathode receiving the input signal and an anode being connected to the second terminal of said capacitor.

7. A device according to claim 1, further comprising means for setting the second terminal of said capacitor at the high level when there is no input pulse.

8. A device according to claim 1, wherein the first terminal of said capacitor is provided by a source and a drain of a P-type MOS transistor connected together; and wherein the second terminal is provided by a gate of the P-type MOS transistor.

9. A device according to claim 8, wherein a body of said P-type MOS transistor is connected to the source and to the drain.

10. A low voltage integrated circuit comprising:
    a device for generating a voltage pulse, the device comprising
        a capacitor having a first terminal and a second terminal, and
        a control circuit comprising
            an input for receiving an input signal having negative pulses with a high level equal to a logic supply voltage of about 1 volt or less for the integrated circuit and a low level equal to zero volts,
            a first circuit for transmitting the low level of the input signal to the second terminal of said capacitor and for providing said capacitor a charging path, and
            a second circuit for transmitting the low level of the input signal to the first terminal of said capacitor with a predetermined delay so that a negative pulse between the high level and a negative level is provided at the second terminal of said capacitor in response to the negative pulse signal.

11. A device according to claim 10, wherein said first element comprises a bipolar transistor connected between the second terminal of said capacitor and ground, and a base of said bipolar transistor being controlled by the input signal.

12. A device according to claim 11, wherein said bipolar transistor comprises a parasitic bipolar transistor of a P-type MOS transistor formed in a well, the P-type MOS transistor having a source, a drain, a gate, and a body; and wherein the source and the body are connected together to an input node of the device, the drain is connected to the second terminal of said capacitor, and the gate is connected to ground.

13. A device according to claim 10, wherein said first circuit comprises a diode.

14. A device according to claim 10, wherein said first circuit element comprises a P-type MOS transistor formed in a well and having a drain and a body forming a diode, said P-type MOS transistor having a source and the body connected together to an input node of the device, a drain connected to the second terminal of said capacitor, and a gate connected to ground.

15. A device according to claim 13, wherein said diode comprises doped polysilicon having a cathode receiving the input signal and an anode being connected to the second terminal of said capacitor.

16. A device according to claim 10, further comprising means for setting the second terminal of said capacitor at the high level when there is no input pulse.

17. A device according to claim 10, wherein the first terminal of said capacitor is provided by a source and a drain of a P-type MOS transistor connected together; and wherein the second terminal is provided by a gate of the P-type MOS transistor.

18. A device according to claim 17, wherein a body of said P-type MOS transistor is connected to the source and to the drain.

19. A method for generating a voltage pulse for a device, the method comprising the steps of:
- receiving an input signal having negative pulses with a high level equal to a logic supply voltage of about 1 volt or less for the device and a low level equal to zero volts;
- transmitting the low level of the input signal to a second terminal of a capacitor;
- charging the capacitor; and
- transmitting the low level of the input signal to a first terminal of the capacitor with a predetermined delay so that a negative pulse between the high level and a negative level is provided at the second terminal of the capacitor in response to the negative pulse signal.

20. A method according to claim 19, wherein the step of receiving the input signal is received by a first circuit comprising a bipolar transistor connected between the second terminal of the capacitor and ground, the method further comprising the step of controlling the base by the input signal.

21. A method according to claim 20, wherein the bipolar transistor comprises a parasitic bipolar transistor of a P-type MOS transistor formed in a well, the P-type MOS transistor having a source, a drain, a gate, and a body; and wherein the source and the body are connected together to an input node of the device, the drain is connected to the second terminal of the capacitor, and the gate is connected to ground.

22. A method according to claim 19, further comprising the step of setting the second terminal of the capacitor at the high level when the input signal is not received.

23. A method according to claim 19, wherein the first terminal of the capacitor is provided by a source and a drain of a P-type MOS transistor connected together; and wherein the second terminal is provided by a gate of the P-type MOS transistor.

24. A method according to claim 23, wherein a body of the P-type MOS transistor is connected to the source and to the drain.

* * * * *